United States Patent
Finocchiaro et al.

(10) Patent No.: US 8,130,047 B2
(45) Date of Patent: Mar. 6, 2012

(54) OPEN LOOP COARSE TUNING FOR A PLL

(75) Inventors: Salvatore Finocchiaro, Dallas, TX (US); Francesco Dantoni, Rome (IT)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 12/771,692

(22) Filed: Apr. 30, 2010

(65) Prior Publication Data

US 2011/0267146 A1 Nov. 3, 2011

(51) Int. Cl.
H03L 7/00 (2006.01)
(52) U.S. Cl. .................. 331/16; 331/2; 331/46; 331/17; 331/34; 327/156; 327/159
(58) Field of Classification Search ................ 331/2, 16, 331/17, 34, 46; 327/156, 159
See application file for complete search history.

(56) References Cited

U.S. PATENT DOCUMENTS

| | | | |
|---|---|---|---|
| 5,909,149 A | 6/1999 | Bath et al. | |
| 5,942,949 A | 8/1999 | Wilson et al. | |
| 6,323,736 B2 | 11/2001 | Jansson | |
| 6,658,748 B1 | 12/2003 | Leipold et al. | |
| 6,661,267 B2 | 12/2003 | Walker et al. | |
| 6,731,712 B1 | 5/2004 | Lindstrom et al. | |
| 6,952,124 B2 | 10/2005 | Pham | |
| 7,015,763 B1 | 3/2006 | Hallivuori et al. | |
| 7,047,146 B2 | 5/2006 | Chuang et al. | |
| 7,133,485 B1 | 11/2006 | Baird et al. | |
| 7,154,346 B2 | 12/2006 | Jaffe et al. | |
| 7,177,382 B2 | 2/2007 | Lindstrom et al. | |
| 7,259,633 B2 * | 8/2007 | Lee et al. ................. | 331/16 |
| 7,301,407 B2 | 11/2007 | Cho | |
| 7,385,452 B2 | 6/2008 | Harjani et al. | |
| 7,532,696 B2 | 5/2009 | Pratt et al. | |
| 7,684,763 B2 | 3/2010 | Boos | |
| 2002/0008593 A1 | 1/2002 | Gomez et al. | |
| 2003/0141936 A1 | 7/2003 | Staszewski et al. | |
| 2003/0206042 A1 | 11/2003 | Walker et al. | |
| 2004/0164812 A1 | 8/2004 | Lindstrom et al. | |

(Continued)

FOREIGN PATENT DOCUMENTS

EP 1256170 4/2004

OTHER PUBLICATIONS

U.S. Appl. No. 12/726,190, filed Mar. 17, 2010.

(Continued)

Primary Examiner — Arnold Kinkead
(74) Attorney, Agent, or Firm — John J. Patti; Wade J. Brady, III; Frederick J. Telecky, Jr.

(57) ABSTRACT

In many types of wireless applications (like wireless modems), it is important that the phase locked loops (PLLs) be able to synthesize clock frequencies in a wide tuning range. Because of the complexity of many conventional PLLs (which were deigned to cover wide tuning ranges), there was often a significant delay to achieve phase and frequency lock. Here, an open loop calibration system is provided to coarse tune a PLL very rapidly. Generally, this calibration system employs binary searches to coarsely adjust a voltage controlled oscillator (VCO) from a VCO bank to within a predetermined range around a target frequency.

20 Claims, 3 Drawing Sheets

U.S. PATENT DOCUMENTS

| | | |
|---|---|---|
| 2005/0137816 A1 | 6/2005 | Chuang et al. |
| 2005/0212609 A1 | 9/2005 | Jasa et al. |
| 2005/0212614 A1 | 9/2005 | Peluso |
| 2007/0057736 A1 | 3/2007 | Baird et al. |

OTHER PUBLICATIONS

"A 4.2 GHz PLL Frequency Synthesizer with an Adaptively Tuned Coarse Loop," IEEE 2007 Custom Intergrated Circuits Conference, pp. 547-550 (Wu, et al.).

"Modeling, Design and Characterization of a New Low-Jitter Analog Dual Tuning LC-VCO PLL Architecture," IEEE J. of Solid-State Circuits, vol. 40, No. 6, Jun. 2005, pp. 1303-1309 (Nonis, et al.).

"A 2.5-Gb/s Multi-Rate 0.25-m CMOS Clock and Data Recovery Circuit Utilizing a Hybrid Analog/Digital Loop Filter and All-Digital Referenceless Frequency Acquisition," IEEE J. of Solid-State Circuits, vol. 41, No. 12, Dec. 2006, pp. 2930-2944 (Perrott, et al.).

\* cited by examiner

OPEN LOOP COARSE TUNING FOR A PLL

TECHNICAL FIELD

The invention relates generally to a phase locked loop (PLL) and, more particularly, to a PLL having open loop coarse tuning logic.

BACKGROUND

PLLs are commonly used in radio frequency (RF) applications, such as in wireless modems. In these types of applications, it is important that the PLL be able to synthesize clock frequencies in a wide tuning range. Because of the complexity of many conventional PLLs (which were deigned to cover wide tuning ranges), there was often a significant delay to achieve phase and frequency lock. Some examples of conventional circuits are: U.S. patent application Ser. No. 12/726,190, Wu et al., "A 4.2 GHz PLL Frequency Synthesizer with an Adaptively Tuned Coarse Loop," *IEEE* 2007 *Custom Intergrated Circuits Conference*, pp. 547-550; Nonis et al., "Modeling, Design and Characterization of a New Low-Jitter Analog Dual Tuning LC-VCO PLL Architecture," *IEEE J. OF Solid-State Circuits*, Vol. 40, No. 6, June 2005, pp. 1303-1309; Perrott et al., "A 2.5-Gb/s Multi-Rate 0.25-m CMOS Clock and Data Recovery Circuit Utilizing a Hybrid Analog/Digital Loop Filter and All-Digital Referenceless Frequency Acquisition," *IEEE J. OF Solid-State Circuits*, Vol. 41, No. 12, December 2006, pp. 2930-2944; U.S. Pat. No. 6,658,748; U.S. Pat. No. 6,952,124; U.S. Pat. No. 7,015,763; U.S. Pat. No. 7,133,485; U.S. Pat. No. 7,301,407; U.S. Pat. No. 7,385,452; U.S. Pat. No. 5,909,149; U.S. Pat. No. 5,942,949; U.S. Pat. No. 6,323,736; U.S. Pat. No. 6,661,267; U.S. Pat. No. 6,731,712; U.S. Pat. No. 7,047,146; U.S. Pat. No. 7,154,346; U.S. Pat. No. 7,177,382; U.S. Pat. No. 7,532,696; U.S. Pat. No. 7,684,763; U.S. Patent Pre-Grant Publ. No. 2002/0008593; U.S. Patent Pre-Grant Publ. No. 2003/0141936; U.S. Patent Pre-Grant Publ. No. 2005/0212609; U.S. Patent Pre-Grant Publ. No. 2005/0212614; U.S. Patent Pre-Grant Publ. No. 2007/0057736; U.S. Patent Pre-Grant Publ. No. 2003/0206042; U.S. Patent Pre-Grant Publ. No. 2004/0164812; U.S. Patent Pre-Grant Publ. No. 2005/0137816; datasheet for Texas Instruments Incorporated's CDCE421; datasheet for Analog Device Inc.'s ADF4350; and European Patent Appl. No. EP1256170.

Therefore, there is a need for an improved PLL.

SUMMARY

A preferred embodiment of the present invention, accordingly, provides an apparatus. An apparatus comprises an input circuit having a phase/frequency detector (PFD) and a charge pump, wherein the input circuit receives a reference clock signal and a feedback signal; a low pass filter that is coupled to the input circuit; a switch network that is coupled to the low pass filter; a calibration generator that is coupled to the switch network; a voltage controlled oscillator (VCO) bank having a plurality of VCOs, wherein the VCO bank is coupled to the switch network, and wherein the VCO bank provides an output clock signal; a divider that is coupled to the VCO bank so as to receive the output clock signal; a prescaler that is coupled to the divider; a counting circuit that is coupled to the prescaler and the input circuit, wherein the counting circuit generates the feedback clock signal; and calibration logic that is coupled to the prescaler, the divider, the switch network, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a predetermined range of the target frequency, and wherein the calibration logic controls the switch network so as to decouple the low pass filter from the VCO bank and to coupled the calibration generator to the low pass filter and the VCO bank.

In accordance with a preferred embodiment of the present invention, the apparatus further comprises a serial peripheral interface (SPI) that is coupled to the calibration logic, wherein the target frequency is adapted to be programmed through the SPI.

In accordance with a preferred embodiment of the present invention, the divider and the prescaler are a variable divider and a variable prescaler that are each controlled by the calibration logic during calibration in the first mode.

In accordance with a preferred embodiment of the present invention, the variable divider is adapted to divided by 1, 2, or 4, and wherein the variable prescaler is adapted to prescale by $4/5$ or $8/9$, and wherein the predetermined range is one least significant bit (LSB) above or below the target frequency.

In accordance with a preferred embodiment of the present invention, the counting circuit further comprises first and second counters that measure the VCO tuning ranges during calibration in the first mode.

In accordance with a preferred embodiment of the present invention, in a second mode of the plurality of modes, the calibration logic measures and stores, for at least one of the VCOs, its tuning range.

In accordance with a preferred embodiment of the present invention, the apparatus further comprises a buffer that is coupled between the VCO bank and the variable divider.

In accordance with a preferred embodiment of the present invention, an apparatus is provided. The apparatus comprises an in-phase/quadrature (IQ) modulator that receives a local oscillator clock signal; and a local oscillator having: an input circuit having a PFD and a charge pump, wherein the input circuit receives a reference clock signal and a feedback signal; a low pass filter that is coupled to the input circuit; a VCO bank having a plurality of VCOs, wherein the VCO bank is coupled to the low pass filter, and wherein the VCO bank provides the local oscillator clock signal; a divider that is coupled to the VCO bank so as to receive the local oscillator clock signal; a prescaler that is coupled to the divider; a counting circuit that is coupled to the prescaler and the input circuit, wherein the counting circuit generates the feedback clock signal; and calibration logic that is coupled to the prescaler, the divider, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a range of one least significant bit (LSB) above or below the target frequency.

In accordance with a preferred embodiment of the present invention, an apparatus is provided. The apparatus comprises a transmit processor; a first digital-to-analog converter (DAC) that is coupled to the transmit processor; a second DAC that is coupled to the transmit processor; an IQ modulator that is coupled to the first and second DACs and that receives a local oscillator clock signal; a local oscillator having: an input circuit having a PFD and a charge pump, wherein the input circuit receives a reference clock signal and a feedback signal; a low pass filter that is coupled to the input circuit; a switch network that is coupled to the low pass filter; a calibration generator that is coupled to the switch network; a VCO bank having a plurality of VCOs, wherein the VCO bank is coupled to the low pass filterswitch network, and wherein the VCO bank provides the local oscillator clock signal; a divider that is coupled to the VCO bank so as to receive the local oscillator clock signal; a prescaler that is coupled to the divider; a counting circuit that is coupled to the prescaler and the input circuit, wherein the counting circuit generates the feedback clock signal; and calibration logic that is coupled to the prescaler, the divider, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a predetermined range of the target frequency, and wherein the calibration logic controls the switch network so as to decouple the low pass filter from the VCO bank and to coupled the calibration generator to the low pass filter and the VCO bank; a programmable gain amplifier that is coupled to the IQ modulator; a power amplifier that is coupled to the programmable gain amplifier; a radio frequency (RF) coupled that is coupled to the power amplifier; and a feedback circuit that is coupled between the transmit processor and the RF coupler.

In accordance with a preferred embodiment of the present invention, the local oscillator further comprises an SPI that is coupled to the calibration logic, wherein the target frequency is adapted to be programmed through the SPI, and wherein the divider and the prescaler are a variable divider and a variable prescaler that are each controlled by the calibration logic during calibration in the first mode.

In accordance with a preferred embodiment of the present invention, the variable divider is adapted to divided by 1, 2, or 4, and wherein the variable prescaler is adapted to prescale by ⅘ or ⅝, and wherein the predetermined range is one LSB above or below the target frequency.

In accordance with a preferred embodiment of the present invention, the counting circuit further comprises first and second counters that measure the VCO tuning ranges during calibration in the first mode, and wherein, in a second mode of the plurality of modes, the calibration logic measures and stores, for each VCO, its tuning range, and wherein the local oscillator further comprises a buffer that is coupled between the VCO bank and the variable divider.

In accordance with a preferred embodiment of the present invention, the IQ modulator further comprises: a first mixer that is coupled to the first DAC; a second mixer that is coupled to the second DAC; a phase adjust circuit that is coupled to the local oscillator, the first mixer, and the second mixer, wherein the phase adjust circuit provides the local oscillator clock signal to the first mixer, and wherein the phase adjust circuit provides a 90° phase shifted local oscillator clock signal to the second mixer; and an adder that is coupled to the first and second mixers.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
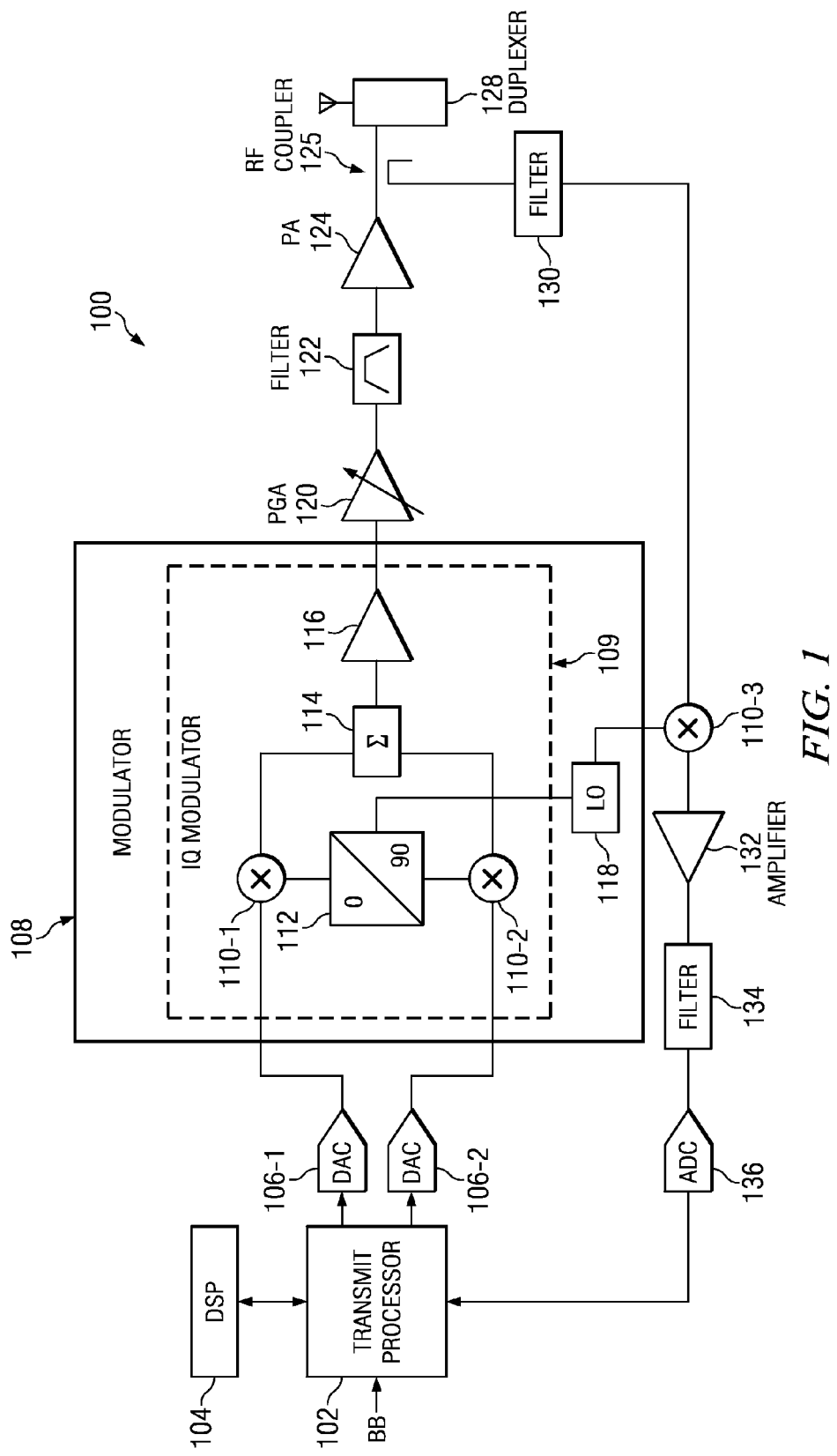
FIG. 1 is circuit diagram of an example of a transmitter in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an example of a transmitter in accordance with a preferred embodiment of the present invention. Transmitter 100 generally comprises a transmit processor 102, a digital signals processor (DSP) 104, digital-to-analog converters (DACs) 106-1 and 106-2, a modulator 118, programmable gain amplifier (PGA) 120, filters 122, 130, and 134, power amplifier 124, an RF coupler 125, duplexer 128, mixer 110-3, amplifier 132, and analog-to-digital converter (ADC) 136. Modulator 108 generally comprises an in-phase/quadrature (IQ) modulator 109 and a local oscillator 118. IQ modulator 109 generally comprises mixers 110-1 and 110-2, phase adjustment circuit 112, adder 114, and amplifier 116.

In operation, the transmitter 100 receives a baseband signal BB and converts it to an RF signal. Typically, the transmit processor 102 and DSP 104 perform several operations on the baseband signal BB (such as upconversion, crest factor reduction, and digital predistortion (DPD)) to generate I and Q digital signals. The I and Q digital signals can then be provided to DACs 106-1 and 106-2 to generate analog I and Q signals. Modulator 108 converts the analog I and Q signals to an RF signal, which is amplified by PGA 120, filtered by filter 122, and amplified by power amplifier 124. The RF signal from power amplifier is provided to duplexer 128 and transmitted. Additionally, RF coupler 125 provides the RF signal from power amplifier to the feedback circuit (which generally comprises filters 130 and 134, mixer 110-3, amplifier 132, and ADC 136) so that the transmit processor can modify its DPD to generally account for the nonlinearity of the power amplifier 124.

Figure 2:
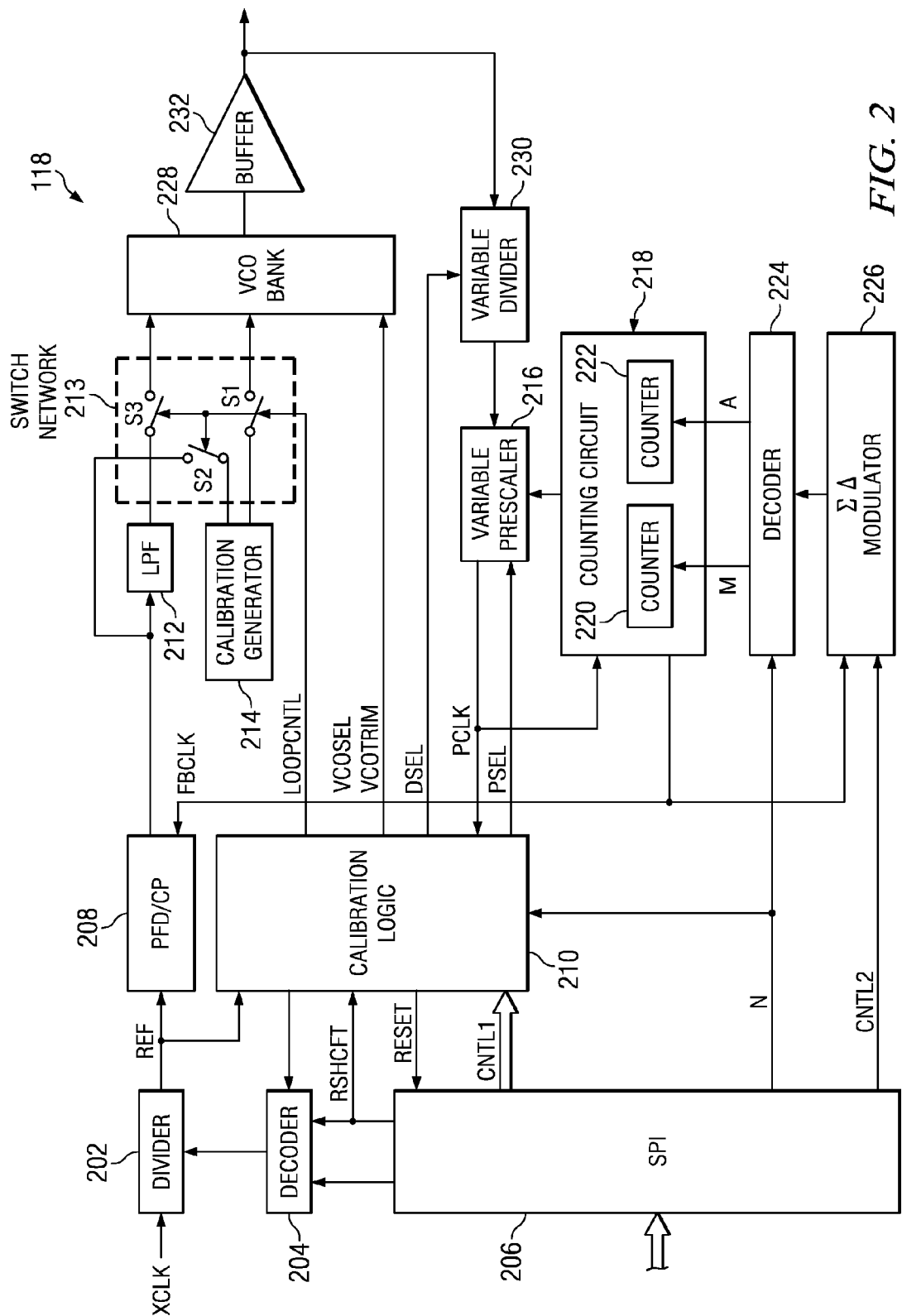
FIG. 2 is a circuit diagram of an example of the local oscillator of FIG. 1.
Figure 3:
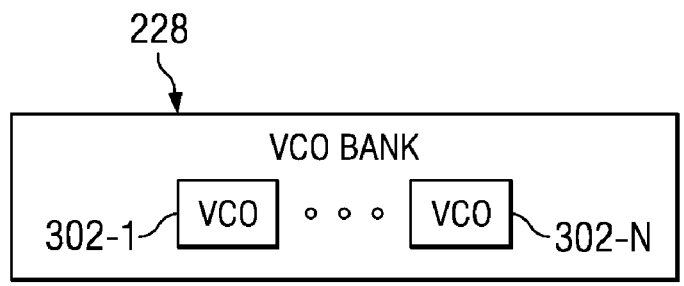
FIG. 3 is a circuit diagram of an example of the voltage controlled oscillator (VCO) bank of FIG. 2.
Figure 4:
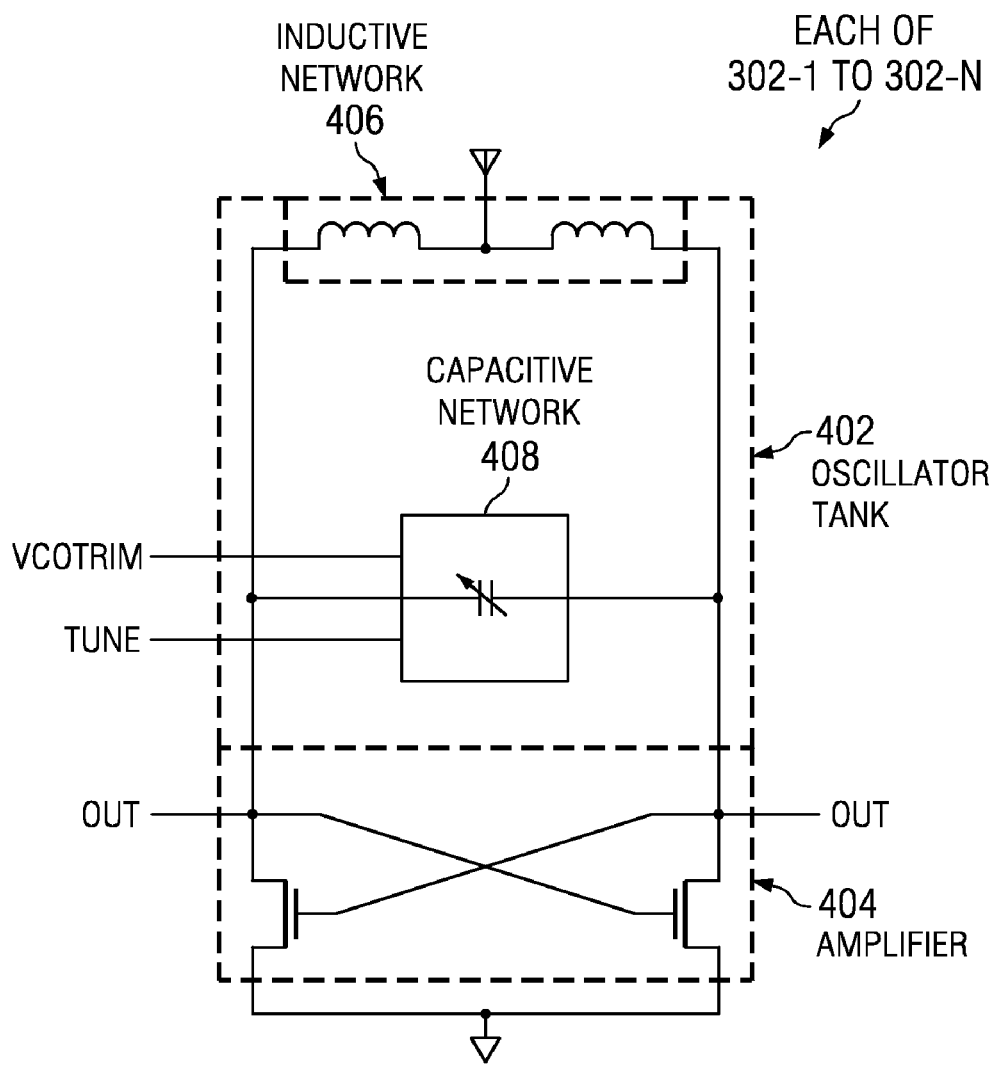
FIG. 4 is a circuit diagram of an exampled of one of the VCOs from the VCO bank of FIG. 3.

An important aspect of the functionality of the transmitter 100 is the generation of a local oscillator clock signal (which is used by mixers 110-1, 110-2, and 110-3). Turning to FIGS. 2-4, local oscillator 118 can be seen in greater detail. Local oscillator 118 is generally a PLL having open loop coarse tuning logic, which is programmable. Local oscillator 118 generally comprises dividers 202 and 230, decoders 204 and 224, serial peripheral interface (SPI) 206, input circuit 208 (which generally includes a phase/frequency detector and charge pump), calibration logic 210, low pass filter 212, switch network 213, a calibration generator 214, prescaler 216, counting circuit 218 (which generally includes counters 220 and 222), sigma-delta modulator 226, VCO bank 228, and buffer 232. VCO bank 228 generally comprises VCOs 302-1 to 302-N, where each VCO 302-1 to 302-N generally includes an amplifier 404 and an oscillator tank 402 with an inductive network 406 and capacitive network 408.

In operation, the SPI 206 enables a user to program a target frequency for the local oscillator 118, and the calibration logic 210 enables coarse tuning range selection is a short period of time. Generally, the SPI 206 operates as a controller which provides control signals CNTL1 and CNTL2 to the calibration logic 210 and sigma-delta modulator 206, and the calibration logic 210 can indicate a reset to the SPI 206 with the assertion of the reset signal RESET. Calibration logic 210 is able to operate in a number of modes, and the default or calibration mode for the calibration logic 210 provides for calibration. During calibration, the calibration logic 210 performs a binary search of the VCOs 302-1 to 302-N within the VCO bank 228 to determine which VCO 302-1 to 302-N has a tuning range that includes the target frequency that is stored in the SPI 206 (which is described in greater detail below). Generally, VCOs 302-1 to 302-N can have non-overlapping tuning ranges, where the overall range of the VCO bank 228 can be between about 2.4 GHz and about 4.8 GHz. Additionally, when performing this binary search, calibration logic 210 sets divider 230 and prescaler 216 (which are each variable) are set to the highest division denominators (i.e., 4 and 8, respectively) through the assertion of the signals DESL and PSEL so that the fastest clock signal is reduced. Preferably, the divider 230 can divide by 1, 2, or 4, while prescaler 216 can prescale by 4/5 and 5/8. Once the VCO 302-1 to 302-N has been selected, the trims the capacitance of the capacitive network 408 of the selected VCO 302-1 to 302-N with a trim signal VCOTRIM (which is described in greater detail below). Typically, the calibration logic VCO to within a range of one least significant bit (LSB) above or below the target frequency (which is generally within a few megahertz of the target frequency). Following the coarse range selection, fast analog lock can be achieved through the application of the analog tuning voltage TUNE to the capacitive network 408 of the selected VCO 302-1 to 302-N. Upon completion of calibration, the divider 230 and prescaler 216 can be released so that the SPI can set their values to enable loop functionality.

Another aspect associated with the local oscillator 118 is calibration speed control or calibration clock control, which generally defines the accuracy of the calibration logic 210. Generally, the calibration clock is selected so that there are a sufficient number of clock periods from the input clock signal XCLK are counted to reduce errors. The calibration clock control or calibration speed control is generally provided from the SPI 206 through signal RSHIFT and divisor R, which is as follows:

$$\text{Calibration Clock} = (XCLK/R) * RSHIFT \quad (1)$$

Typically, the signal RSHIFT is a 4-bit signal having a value that ranges from 1/128 for 0000 to 128 for 1111 with 16 permutations (for the 4-bit signal) that correspond to power of 2 coefficients (i.e., 1/64, 1/32, 2, 4, 8, etc.). Additionally, decoder 204 decodes the signals from the SPI 206 and provides the divisor R to divider 202. If there is an error, and overflow signal can be provided from the calibration logic 210 to decoder 204.

In operation, SPI 206 can generally implement controls for calibration accuracy. During the calibration mode, the loop control signal LOOPCNTL is asserted to close switches S1 and S2 of switch network 213 and open switch S3 of switch network 213. This enables local oscillator 118 to enter open loop operation where the calibration generator 214 provides a reference voltage (preferably about 1V) to the VCO bank 228 and low pass filter or loop filter 212. Also, preprogrammed division (for divider 230) and prescaling (for prescaler 216) are modified by calibration logic 210 to have the largest selectable denominator, and the SPI 206 provides a divider ratio N to decoder 224 and calibration logic 210 (which is the ratio between the desired output frequency and the comparison frequency at the phase detector in the input circuit 208). Decoder 224 then decodes, in a first step, the divider ratio N according to the preprogrammed division of divider 230 as follows:

$$N_{TEMP} = N_{SPI}/4 \text{ if the selected division is 1; or} \quad (2)$$

$$N_{TEMP} = N_{SPI}/2 \text{ if the selected division is 2; or} \quad (3)$$

$$N_{TEMP} = N_{SPI} \text{ if the selected division is 4,} \quad (4)$$

where $N_{TEMP}$ is the temporary divider ratio and $N_{SPI}$ is the preprogrammed divider ratio. Following the first decoding step, the decoder 224 performs a second decode step to generate a temporary count signal $N_{COUNT}$ through control of signal RSHIFT, which is as follows:

$$N_{COUNT} = N_{TEMP}/128 \text{ for } RSHIFT \text{ of } 1/128; \text{ or} \quad (5)$$

$$N_{COUNT} = N_{TEMP} \text{ for } RSHIFT \text{ of 1; or} \quad (6)$$

$$N_{COUNT} = N_{TEMP} * 128 \text{ for } RSHIFT \text{ of 128.} \quad (7)$$

For fractional-N functionality, a fractional portion can be provided for equations (2)-(7) with control being provided through the use of decoder 204, divider 202, and sigma-delta modulator 226. Once the temporary count signal $N_{COUNT}$ has been determined, decoder 224 determines the signals M and A for counters 220 and 222, respectively, such that:

$$N = MP + A, \quad (8)$$

where P is the prescaler division ratio. Based on signals M and A (where signal M is generally larger than signal A), counting circuit 218 will divide the output signal from the VCO bank 228 by P+1 for "A" prescaler pulses and by P-1 for M-A prescaler pulses.

In order to make use of these calculations, the calibration logic 210 utilizes an internal counter. This internal counter counts the number of pulses of the prescaled clock signal PCLK for one period of the calibration clock (i.e., equation (1)). The resultant count signal from this internal counter is then compared to calculated count signal $N_{COUNT}$, and selection of VCO 302-1 to 302-N is based on whether a selected VCO 302-1 to 302-N satisfies the following condition:

$$N_{MIN} < N_{COUNT} < N_{MAX},$$

where $N_{MIN}$ is the count for signal VCOTRIM asserting all switches in the respective capacitive network 408 and $N_{MAX}$ is the count for signal VCOTRIM asserting none of the switches in the respective capacitive network 408. Thus, calibration logic 210 is able to select VCO 302-1 to 302-N with a tuning range that includes the target frequency through a binary search of the VCOs 302-1 to 302-N, beginning with VCO 302-1 to 302-N at or near the center of the tuning range for the VCO bank 228.

Once the VCO 302-1 to 302-N is selected, the calibration logic 210 can use the calculated count signal $N_{COUNT}$ to determine the scope of the trim signal VCOTRIM. Generally, the calibration logic 210 iteratively adjusts the trim signal VCOTRIM until its count (from its internal counter) is generally equal to the calculated count signal $N_{COUNT}$ by performing a binary search beginning from the middle capacitive value of the selected VCO 302-1 to 302-N. Typically, an exact equality is not reached, but the calibration logic 210 can cycle through all or less than all of the values of the trim signal VCOTRIM. In many cases, an error or range is tolerated, and which error can be preprogrammed into the SPI 206. Typically, the lowest error is set as the default error and is generally within one LSB above or below the target frequency.

As an alternative to determining the tuning range for each VCO 302-1 to 302-N for each calibration, a counter mode for calibration logic 210 can be employed. This counter mode operates a test mode, where a VCO 302-1 to 302-N from VCO bank 228 is "mapped." Essentially, the tuning range of the selected VCO 302-1 to 302-N is determined and stored in the SPI 206 for future read-back. Thus, the data for the selected VCO 302-1 to 302-N can be rapidly read-back for calibration.

Additionally, local oscillator 118 can also use several other modes of operation, namely VCO select mode, an SPI select mode, and a lock detector mode. The VCO select mode has similar function to the counter mode. The SPI select mode is a programming mode for SPI 206, and lock detect mode is a mode where the calibration logic 210 monitors the input circuit 210, executing calibration when a unlock is detected.

Moreover, upon completion of calibration, the local oscillator 118 can be returned to normal operation. Typically, the loop control signal LOOPCNTL is de-asserted, opening switches S1 and S2 and closing switch S3. Because the reference voltage from the calibration generator 214 was supplied to the loop filter 212, the loop filter 212 is precharged, which reduces effects from transients when transitioning between open loop and closed loop operations. Additionally, divider 230 and prescaler 216 are returned to the preprogrammed divisors.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an input circuit having a phase/frequency detector (PFD) and a charge pump, wherein the input circuit receives a reference clock signal and a feedback signal;
    a low pass filter that is coupled to the input circuit;
    a switch network that is coupled to the low pass filter;
    a calibration generator that is coupled to the switch network;
    a voltage controlled oscillator (VCO) bank having a plurality of VCOs, wherein the VCO bank is coupled to the switch network, and wherein the VCO bank provides an output clock signal;
    a divider that is coupled to the VCO bank so as to receive the output clock signal;
    a prescaler that is coupled to the divider;
    a counting circuit that is coupled to the prescaler and the input circuit, wherein the counting circuit generates the feedback clock signal; and
    calibration logic that is coupled to the prescaler, the divider, the switch network, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a predetermined range of the target frequency, and wherein the calibration logic controls the switch network so as to decouple the low pass filter from the VCO bank and to couple the calibration generator to the low pass filter and the VCO bank.

2. The apparatus of claim 1, wherein the apparatus further comprises a serial peripheral interface (SPI) that is coupled to the calibration logic, wherein the target frequency is adapted to be programmed through the SPI.

3. The apparatus of claim 2, wherein the divider and the prescaler are a variable divider and a variable prescaler that are each controlled by the calibration logic during calibration in the first mode.

4. The apparatus of claim 3, wherein the variable divider is adapted to divided by 1, 2, or 4, and wherein the variable prescaler is adapted to prescale by ⅘ or ⅝, and wherein the predetermined range is one least significant bit (LSB) above or below the target frequency.

5. The apparatus of claim 3, wherein the counting circuit further comprises first and second counters that measure the VCO tuning ranges during calibration in the first mode.

6. The apparatus of claim 5, wherein, in a second mode of the plurality of modes, the calibration logic measures and stores, for at least one of the VCOs, its tuning range.

7. The apparatus of claim 6, wherein the apparatus further comprises a buffer that is coupled between the VCO bank and the variable divider.

8. An apparatus comprising:
    an in-phase/quadrature (IQ) modulator that receives a local oscillator clock signal; and
    a local oscillator having:
        an input circuit having a PFD and a charge pump, wherein the input circuit receives a reference clock signal and a feedback signal;
        a low pass filter that is coupled to the input circuit;
        a switch network that is coupled to the low pass filter;
        a calibration generator that is coupled to the switch network;
        a VCO bank having a plurality of VCOs, wherein the VCO bank is coupled to the switch network, and wherein the VCO bank provides the local oscillator clock signal;
        a divider that is coupled to the VCO bank so as to receive the local oscillator clock signal;
        a prescaler that is coupled to the divider;
        a counting circuit that is coupled to the prescaler and the input circuit, wherein the counting circuit generates the feedback clock signal; and
        calibration logic that is coupled to the prescaler, the divider, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a predetermined range of the target frequency, and wherein the calibration logic controls the switch network so as to decouple the low pass filter from the VCO bank and to couple the calibration generator to the low pass filter and the VCO bank.

9. The apparatus of claim 8, wherein the local oscillator further comprises an SPI that is coupled to the calibration logic, wherein the target frequency is adapted to be programmed through the SPI.

10. The apparatus of claim 9, wherein the divider and the prescaler are a variable divider and a variable prescaler that are each controlled by the calibration logic during calibration in the first mode.

11. The apparatus of claim 10, wherein the variable divider is adapted to divided by 1, 2, or 4, and wherein the variable prescaler is adapted to prescale by ⅘ or ⅝, and wherein the predetermined range is one least significant bit (LSB) above or below the target frequency.

12. The apparatus of claim 10, wherein the counting circuit further comprises first and second counters that measure the VCO tuning ranges during calibration in the first mode.

13. The apparatus of claim 12, wherein, in a second mode of the plurality of modes, the calibration logic measures and stores, for at least one of the VCOs, its tuning range.

14. The apparatus of claim 13, wherein the local oscillator further comprises a buffer that is coupled between the VCO bank and the variable divider.

15. The apparatus of claim 13, wherein the IQ modulator further comprises:
  a first mixer;
  a second mixer;
  a phase adjust circuit that is coupled to the local oscillator, the first mixer, and the second mixer, wherein the phase adjust circuit provides the local oscillator clock signal to the first mixer, and wherein the phase adjust circuit provides a 90° phase shifted local oscillator clock signal to the second mixer; and
  an adder that is coupled to the first and second mixers.

16. An apparatus comprising:
  a transmit processor;
  a first digital-to-analog converter (DAC) that is coupled to the transmit processor;
  a second DAC that is coupled to the transmit processor;
  an IQ modulator that is coupled to the first and second DACs and that receives a local oscillator clock signal;
  a local oscillator having:
    an input circuit having a PFD and a charge pump, wherein the input circuit receives a reference clock signal and a feedback signal;
    a low pass filter that is coupled to the input circuit;
    a switch network that is coupled to the low pass filter;
    a calibration generator that is coupled to the switch network;
    a VCO bank having a plurality of VCOs, wherein the VCO bank is coupled to the switch network, and wherein the VCO bank provides the local oscillator clock signal;
    a divider that is coupled to the VCO bank so as to receive the local oscillator clock signal;
    a prescaler that is coupled to the divider;
    a counting circuit that is coupled to the prescaler and the input circuit, wherein the counting circuit generates the feedback clock signal; and
    calibration logic that is coupled to the prescaler, the divider, and the VCO bank, wherein the calibration logic calibrates the VCO bank in a first mode of a plurality of modes for a target frequency, and wherein the calibration logic selects at least one of the VCOs having a tuning range that includes the target frequency during calibration in the first mode, and wherein the calibration logic trims the selected VCO to within a predetermined range of the target frequency, and wherein the calibration logic controls the switch network so as to decouple the low pass filter from the VCO bank and to coupled the calibration generator to the low pass filter and the VCO bank;
  a programmable gain amplifier that is coupled to the IQ modulator;
  a power amplifier that is coupled to the programmable gain amplifier;
  a radio frequency (RF) coupled that is coupled to the power amplifier; and
  a feedback circuit that is coupled between the transmit processor and the RF coupler.

17. The apparatus of claim 16, wherein the local oscillator further comprises an SPI that is coupled to the calibration logic, wherein the target frequency is adapted to be programmed through the SPI, and wherein the divider and the prescaler are a variable divider and a variable prescaler that are each controlled by the calibration logic during calibration in the first mode.

18. The apparatus of claim 17, wherein the variable divider is adapted to divided by 1, 2, or 4, and wherein the variable prescaler is adapted to prescale by ⅘ or ⅝, and wherein the predetermined range is one LSB above or below the target frequency.

19. The apparatus of claim 17, wherein the counting circuit further comprises first and second counters that measure the VCO tuning ranges during calibration in the first mode, and wherein, in a second mode of the plurality of modes, the calibration logic measures and stores, for each VCO, its tuning range, and wherein the local oscillator further comprises a buffer that is coupled between the VCO bank and the variable divider.

20. The apparatus of claim 19, wherein the IQ modulator further comprises:
  a first mixer that is coupled to the first DAC;
  a second mixer that is coupled to the second DAC;
  a phase adjust circuit that is coupled to the local oscillator, the first mixer, and the second mixer, wherein the phase adjust circuit provides the local oscillator clock signal to the first mixer, and wherein the phase adjust circuit provides a 90° phase shifted local oscillator clock signal to the second mixer; and
  an adder that is coupled to the first and second mixers.

* * * * *